(12) United States Patent
Aikawa et al.

(10) Patent No.: US 7,854,050 B2
(45) Date of Patent: Dec. 21, 2010

(54) METHOD OF MANUFACTURING A SURFACE ACOUSTIC WAVE DEVICE

(75) Inventors: Shunichi Aikawa, Kanagawa (JP);
Takumi Kooriike, Kanagawa (JP);
Jyouji Kimura, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 72 days.

(21) Appl. No.: 12/239,525

(22) Filed: Sep. 26, 2008

(65) Prior Publication Data
US 2009/0096321 A1 Apr. 16, 2009

(30) Foreign Application Priority Data
Oct. 12, 2007 (JP) .................. 2007-266214

(51) Int. Cl.
*H04R 17/10* (2006.01)
(52) U.S. Cl. .................. 29/25.35; 29/594; 29/841; 310/313 B; 310/313 C
(58) Field of Classification Search ............... 29/25.35, 29/594, 846, 841; 310/313 R, 313 B, 313 C, 310/349
See application file for complete search history.

(56) References Cited

U.S. PATENT DOCUMENTS

| 6,310,421 | B2 | 10/2001 | Morishima | |
|---|---|---|---|---|
| 6,931,699 | B2 * | 8/2005 | Pahl et al. | 29/25.35 |
| 6,998,687 | B2 | 2/2006 | Inoue et al. | |

FOREIGN PATENT DOCUMENTS

| JP | 05291864 A | * 11/1993 |
|---|---|---|
| JP | 2000-114918 A | 4/2000 |
| JP | 2004104117 A | * 4/2004 |
| JP | 2005-123820 | 5/2005 |
| JP | 2005123820 (A) | 5/2005 |
| WO | WO 02/061943 A1 | 8/2002 |
| WO | WO 2008/081935 A1 | 7/2008 |
| WO | WO 2009/001650 A1 | 12/2008 |

* cited by examiner

*Primary Examiner*—A. Dexter Tugbang
(74) *Attorney, Agent, or Firm*—Arent Fox LLP

(57) ABSTRACT

A surface acoustic wave device is enable to prevent electrode erosion, without any specific environmental process. The surface acoustic wave device includes a piezoelectric substrate, an electrode for the formation of surface acoustic wave, being formed on the piezoelectric substrate, on the piezoelectric substrate, a frame-shaped layer surrounding the electrode for the formation of surface acoustic wave, and a lid body formed on the frame-shaped layer by bonding, so as to form a hollow portion between the lid body and the electrode for the formation of surface acoustic wave. The frame-shaped layer and the lid body include photosensitive resin, and the lid body includes a through hole, and the through hole is sealed with a halogen-free thermosetting resin.

7 Claims, 6 Drawing Sheets

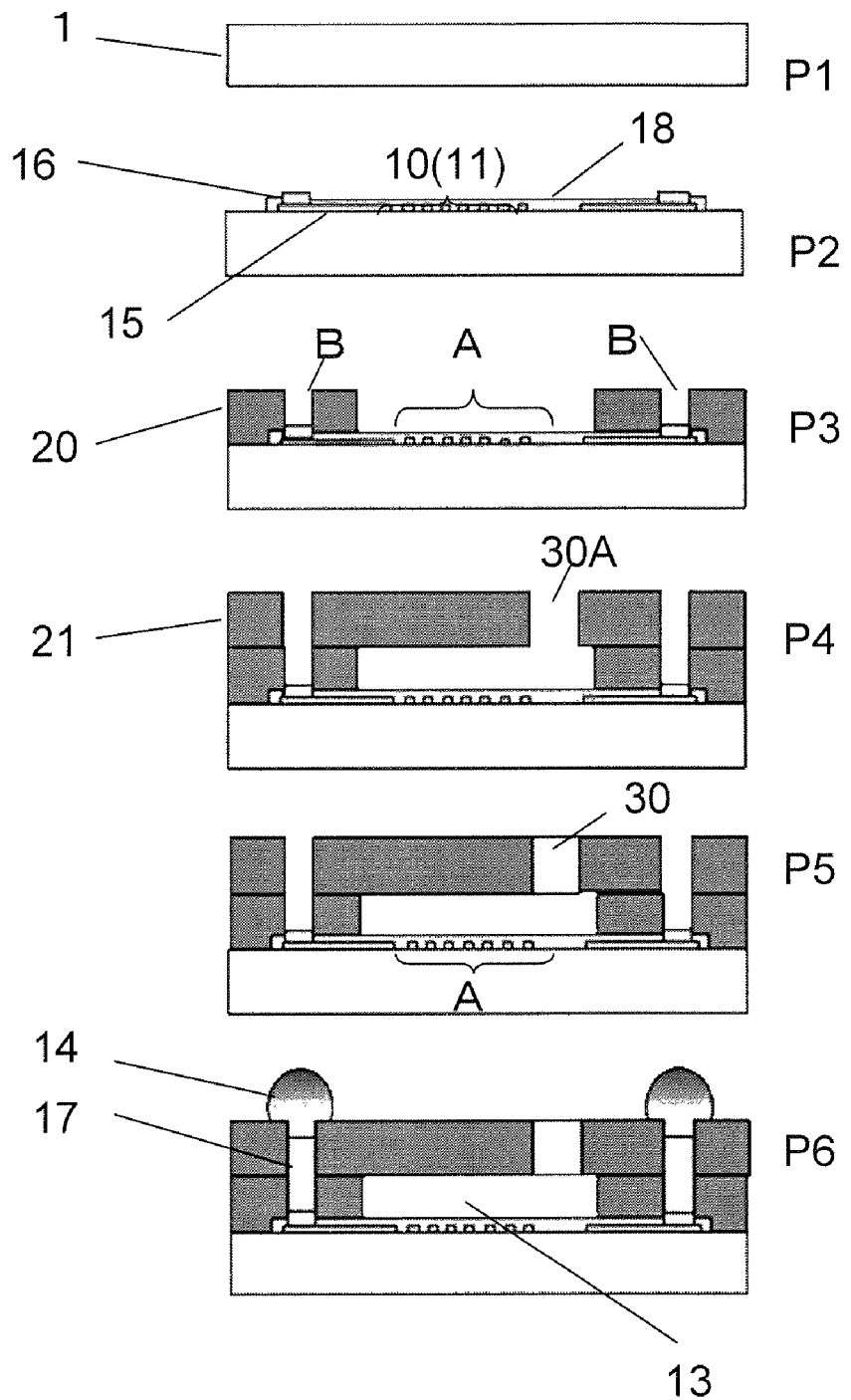

Effect of vacuum baking at 200°C for 1 hour

METHOD OF MANUFACTURING A SURFACE ACOUSTIC WAVE DEVICE

CROSS-REFERENCE TO RELATED APPLICATIONS

This application is based upon and claims the benefit of priority from the prior Japanese Patent Application No. 2007-266214, filed on Oct. 12, 2007, the entire contents of which are incorporated herein by reference.

BACKGROUND OF THE INVENTION

1. Field of the Invention

The present invention relates to a surface acoustic wave device for use in mobile communication equipment etc., and a manufacturing method therefor.

2. Description of the Related Art

The surface acoustic wave device has widely been used conventionally, as a duplexer and a filter for use in the mobile communication equipment etc.

As the prior art, FIG. 1 shows an exemplary configuration of the surface acoustic wave device described in Patent document 1.

In FIG. 1, there is shown a schematic configuration of the cross section of the surface acoustic wave device being individually cut out. A surface acoustic wave (SAW) device chip 1 is disposed on a circuit substrate 2, with each electrode for the formation of surface acoustic wave being placed on the upper side.

The electrode for the formation of surface acoustic wave disposed on SAW device chip 1 includes an interdigital transducer (IDT) 10 for exciting a surface acoustic wave and a pair of reflective electrodes 11 each disposed on each side of the IDT 10. The electrode is connected to an electrode 3 on the circuit substrate 2 side by means of a bonding wire 12 via a metal post.

Further, in the configuration shown in FIG. 1, SAW device chip 1 is covered with an insulating rim 4 and a lid 5, so that a hollow 13 is formed on a surface acoustic wave propagation path.

Now, in Patent document 1, as an effect of covering SAW device chip 1 with insulating rim 4 and lid 5, there is described that "because protection is made while a hollow (9) is maintained on the surface of a functional portion, stable manufacturing can be made without a risk of damaging a functional portion (1a) by mistake when the chip (1) is handled. Also, because the functional portion 1a is simply sealed with first and second insulating films 2a, 2b, it is not always necessary to tightly seal as in the conventional surface acoustic wave equipment. Thus, low-cost surface acoustic wave equipment is obtainable" (in the paragraph 0017 of Patent document 1).

In contrast, because the material forming the IDT and the reflective electrode is an aluminum alloy, it is known that the electrode becomes deteriorated because of eroded aluminum when being exposed in the atmosphere having high humidity in a long term (for example, lines 17-19 of page 1 in Patent document 2).

Specifically, FIG. 2 is a diagram illustrating the structure of a SAW device having the structure shown in Patent document 2. A connection electrode of SAW device chip 1 is connected to an electrode 3 on the circuit substrate 2 side through a metal ball 14. Thus, by means of metal ball 14, a hollow 13 is formed between SAW device chip 1 and circuit substrate 2.

Further, a resin cover 6 is formed on the upper face and the side faces of the SAW device chip 1. In order to prevent erosion of the electrode, with regard to the above resin cover 6, it is described that the resin cover 6 has to be formed of a resin having a small chlorine ion content.

[Patent document 1] Japanese Unexamined Patent Publication No. 2000-114918.

[Patent document 2] WIPO international publication No. WO 02/061943.

In the above Patent document 1, it is shown that photosensitive films are used for the insulating rim 4 and lid 5 (refer to FIG. 3 of Patent document 1). Further, it is obvious that the photosensitive film includes a halogen compound from the characteristic thereof, and in the manufacturing process of the SAW device, at the time of heating such as reflow, a portion of the halogen gas is emitted from the photosensitive film to the hollow (9)

Therefore, similarly to the case described in the aforementioned Patent document 2, there is a risk of bad influence such as erosion produced on the IDT, which is an electrode for the formation of surface acoustic wave disposed in the hollow, and the reflective electrode. However, in Patent document 1, there is neither disclosure nor suggestion about the influence on the electrodes caused by the halogen gas, not to mention the avoidance of the influence on such electrodes.

Meanwhile, as described above, the problem of an eroded electrode is shown in Patent document 2. As a method to solve the problem, it is disclosed that, through predetermined environmental processes (heating and pressing processes), a resin material of reduced chlorine ion content is to be used as a coating material.

SUMMARY OF THE INVENTION

From the viewpoint described above, the objective of the present invention is to provide a surface acoustic wave device enabling prevention of electrode erosion, without requiring such predetermined environmental processes as described in Patent document 2 to obtain a resin material having a small chlorine ion content, and the manufacturing method therefor.

In order to achieve the above object, according to a first aspect of the present invention there is provided a surface acoustic wave device having a piezoelectric substrate, an electrode for the formation of surface acoustic wave, being formed on the piezoelectric substrate, on the piezoelectric substrate, a frame-shaped layer surrounding the electrode for the formation of surface acoustic wave, and a lid body formed on the frame-shaped layer by bonding, so as to form a hollow portion between the lid body and the electrode for the formation of surface acoustic wave, wherein the frame-shaped layer and the lid body include photosensitive resin, and the lid body includes a through hole, and the through hole is sealed with a halogen-free thermosetting resin.

As such, the frame-shaped layer and the lid body include photosensitive resin, and the lid body has the through hole. Further, the through hole is sealed with the halogen-free thermosetting resin. By this, a halogen compound included in the photosensitive resin and produced through a heating process, which is essentially needed in the manufacturing process of the SAW device, is emitted via the through hole as a halogen gas. Accordingly, no halogen gas remains in the hollow sealed by the halogen-free thermosetting resin, enabling prevention of the IDT electrode from being eroded caused by the halogen gas.

A manufacturing method of a surface acoustic wave device according to the present invention comprises the processes of, on a piezoelectric substrate, forming an electrode for the formation of surface acoustic wave, forming a frame-shaped layer surrounding the electrode for the formation of surface acoustic wave being formed on the piezoelectric substrate, on the frame-shaped layer, forming a lid body by bonding, having a through hole, so as to form a hollow between the lid body and the electrode for the formation of surface acoustic wave, removing a halogen gas generated from the frame-shaped layer and the lid body via the through hole, by heating in vacuum in a state of being bonded with the lid body, and after removing the halogen gas, sealing the through hole with a halogen-free thermosetting resin.

Thus, according to the manufacturing method of the present invention, because no halogen gas remains in the hollow sealed by the halogen-free thermosetting resin, it is possible to obtain a highly reliable SAW device in which the erosion of the IDT electrode caused by halogen gas is prevented.

BRIEF DESCRIPTION OF THE DRAWINGS

FIG. 5 is a process diagram explaining the manufacturing process of a first embodiment of the a surface acoustic wave device according to the present invention;

DETAILED DESCRIPTION OF THE PREFERRED EMBODIMENTS

Embodiments of the present invention will now be described with reference to the accompanying drawings.

First Embodiment

Figure 1:
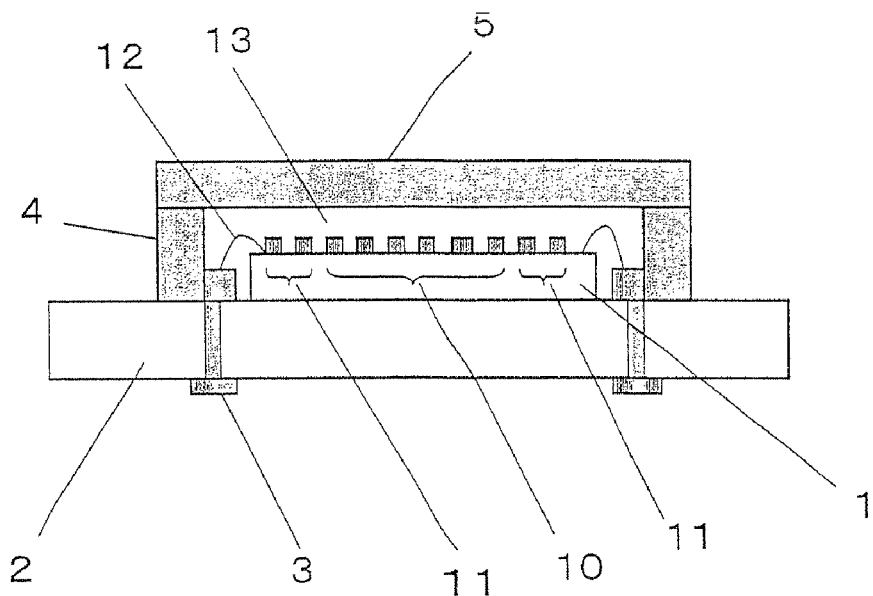
FIG. 1 shows an exemplary configuration of the surface acoustic wave device described in Patent document 1.
Figure 2:
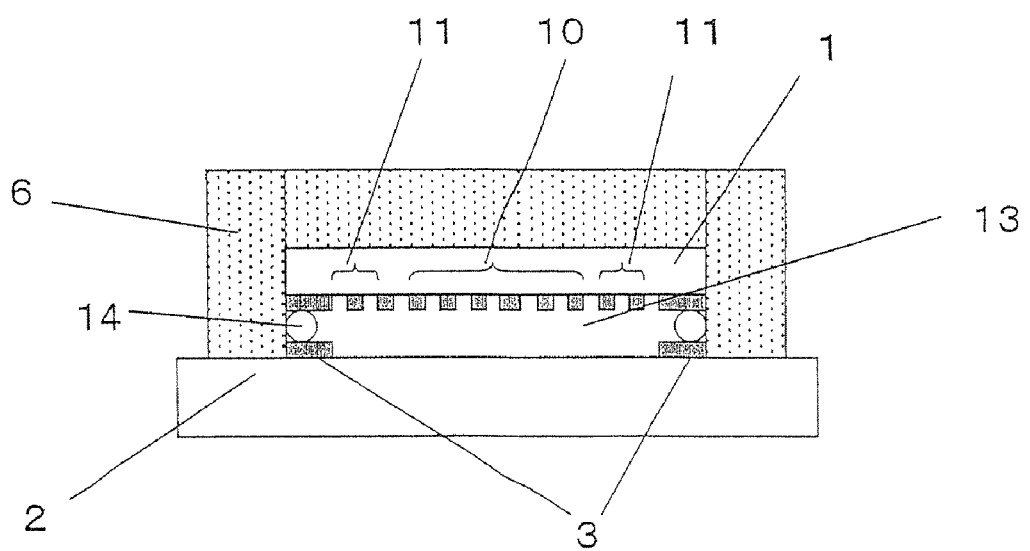
FIG. 2 is a diagram illustrating the structure of a SAW device having the structure shown in Patent document 2.
Figure 3:
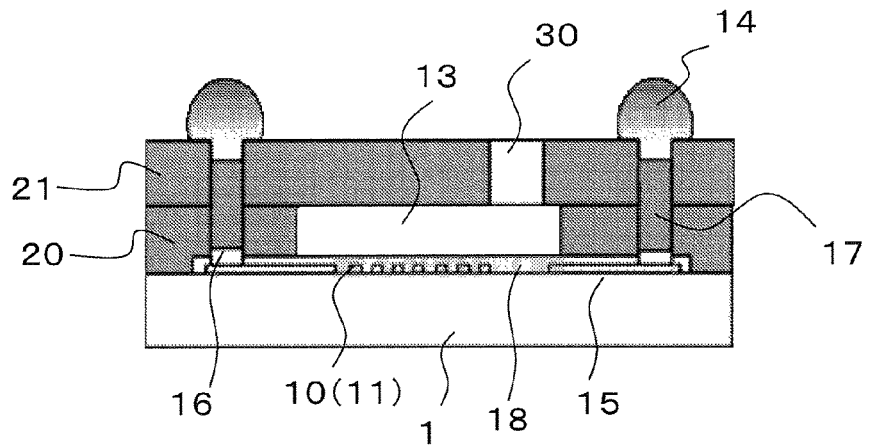
FIG. 3 shows a diagram illustrating a schematic cross section of a first embodiment of the surface acoustic wave (SAW) device according to the present invention.

FIG. 3 shows a diagram illustrating a schematic cross section of a first embodiment of the surface acoustic wave (SAW) device according to the present invention. FIG. 5 is a process diagram explaining the manufacturing process thereof.

Here, the SAW device shown in the figures represents only one SAW device, on the assumption of a state such that each SAW device is formed by separating a plurality of SAW devices, simultaneously formed on a wafer, into individual pieces by dicing at the completion of manufacturing.

In FIG. 3, a piezoelectric substrate 1 formed of $LiTaO_3$ etc. is prepared (processing process P1). As the electrode to form surface acoustic wave, on the piezoelectric substrate 1, there are formed an IDT 10 constituted of aluminum alloy of Al—Cu, which is a drive electrode portion to excite surface acoustic wave, and a reflective electrode 11. Also, a wiring electrode 15 for external connection is formed. Further, a protection film 18 constituted of a silicon compound (such as $SiO_2$ and SiN) is formed over piezoelectric substrate 1, the drive electrode portion and wiring electrode 15 (processing process P2).

At this time, to ensure connection to a metal post 17, a barrier metal 16 constituted of Ti/Au is formed on wiring electrode 15 (processing process P2).

Next, on piezoelectric substrate 1, an epoxy photosensitive negative resist is spin coated with a thickness of 30 µm. Then, through patterning exposure and development, the resists in a drive electrode portion area A and a metal post formation portion B (refer to FIG. 5) are removed (processing process P3).

Through the above processing, there is formed a frame-shaped layer 20 in which only the drive electrode portion A and the metal post formation portion B are not covered with the resist.

Next, a photosensitive film negative resist 21 to form a lid body 21 with a thickness of 30 µm is bonded on frame-shaped layer 20 by means of a tenting method. Similar to the case of the processing process P3, through patterning exposure and development, the resists in the metal post formation portion B and a through hole portion 30A are removed (processing process P4). With this, the drive electrode portion A comes to have a hollow structure having through hole 30A.

Thereafter, heating is performed in vacuum (approximately 1 Torr) to 200-250° C. By this, although a halogen gas is generated by heating from frame-shaped layer 20 and lid body 21, which are photosensitive negative resists, the generated halogen gas can be removed via through hole 30A.

Additionally, in order to efficiently remove the halogen gas generated from frame-shaped layer 20 and lid body 21, it is preferable to heat in vacuum after being retained for a predetermined time under a high humidity environment (85-100% RH) and a high temperature environment (100-120° C.). Alternatively, it may also be possible to heat (100-250° C.) piezoelectric substrate 1 in $H_2O$ plasma.

Next, it is possible to seal the through hole 30A by means of a print method using a liquid halogen-free thermosetting resin 30. With this, it is possible to form hollow 13 of drive electrode portion A not including the halogen gas (processing process P5).

Thereafter, there are formed nickel metal post 17 on the metal post formation portion B, and a solder ball 14 of SnAgCu alloy thereon (processing process P6).

Figure 4A:
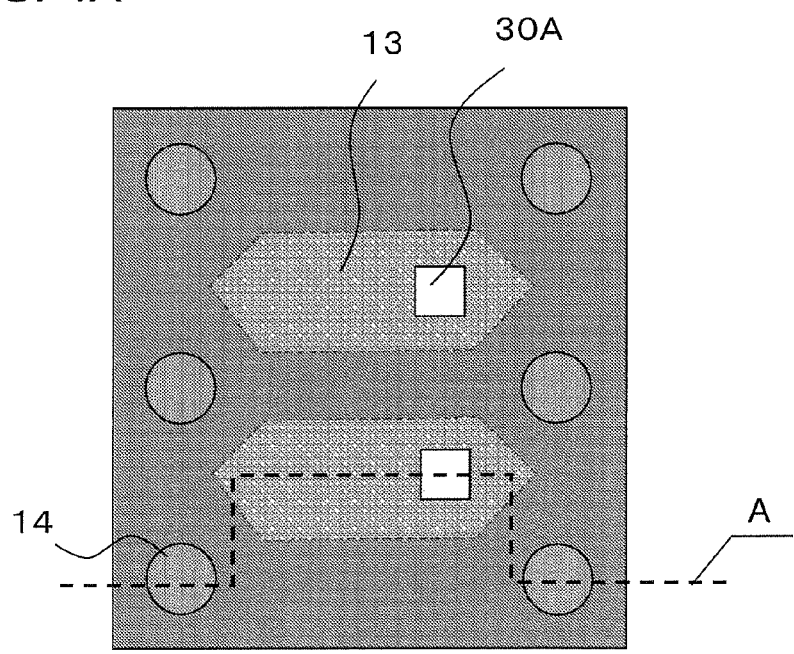
FIG. 4A is a plan viewed from the solder ball 14 side.
Figure 4B:
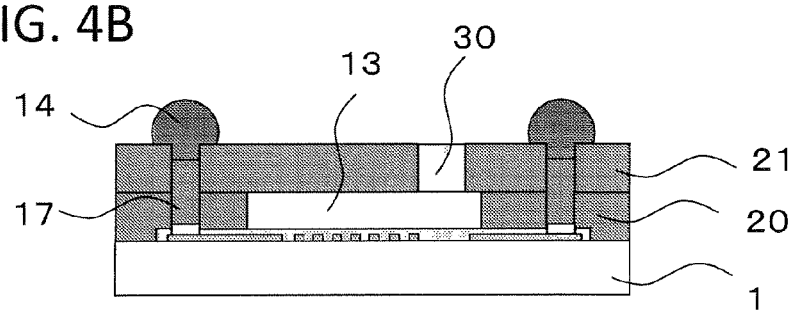
FIG. 4B is a cross section along the A-A line shown in FIG. 4A.

Here, FIGS. 4A, 4B are diagrams explaining a ratio of the size of through hole 30A, capable of effectively discharging the halogen gas, to the size of hollow 13, as an embodiment.

FIG. 4A is a plan viewed from the solder ball 14 side, and FIG. 4B is a cross section along the A-A line shown in FIG. 4A. In FIG. 4A, the area size of the plane of hollow 13 is shown with broken lines in a perspective manner. Understandably, there are formed two surface acoustic wave device areas.

As an embodiment, the area ratio of through hole 30A to a plane area of hollow 13 is 0.1 in approximation.

Second Embodiment

Figure 6:
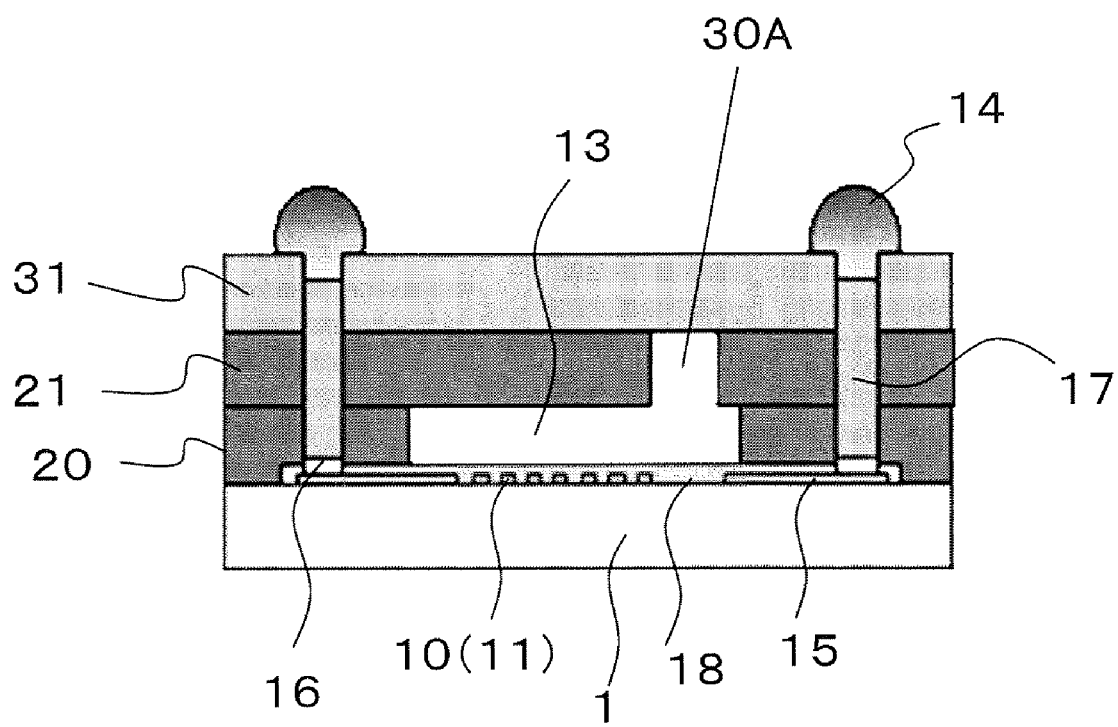
FIG. 6 is a diagram illustrating a schematic cross section of a second embodiment of the SAW device according to the present invention.

FIG. 6 is a diagram illustrating a schematic cross section of a second embodiment of the SAW device according to the present invention.

Figure 7:
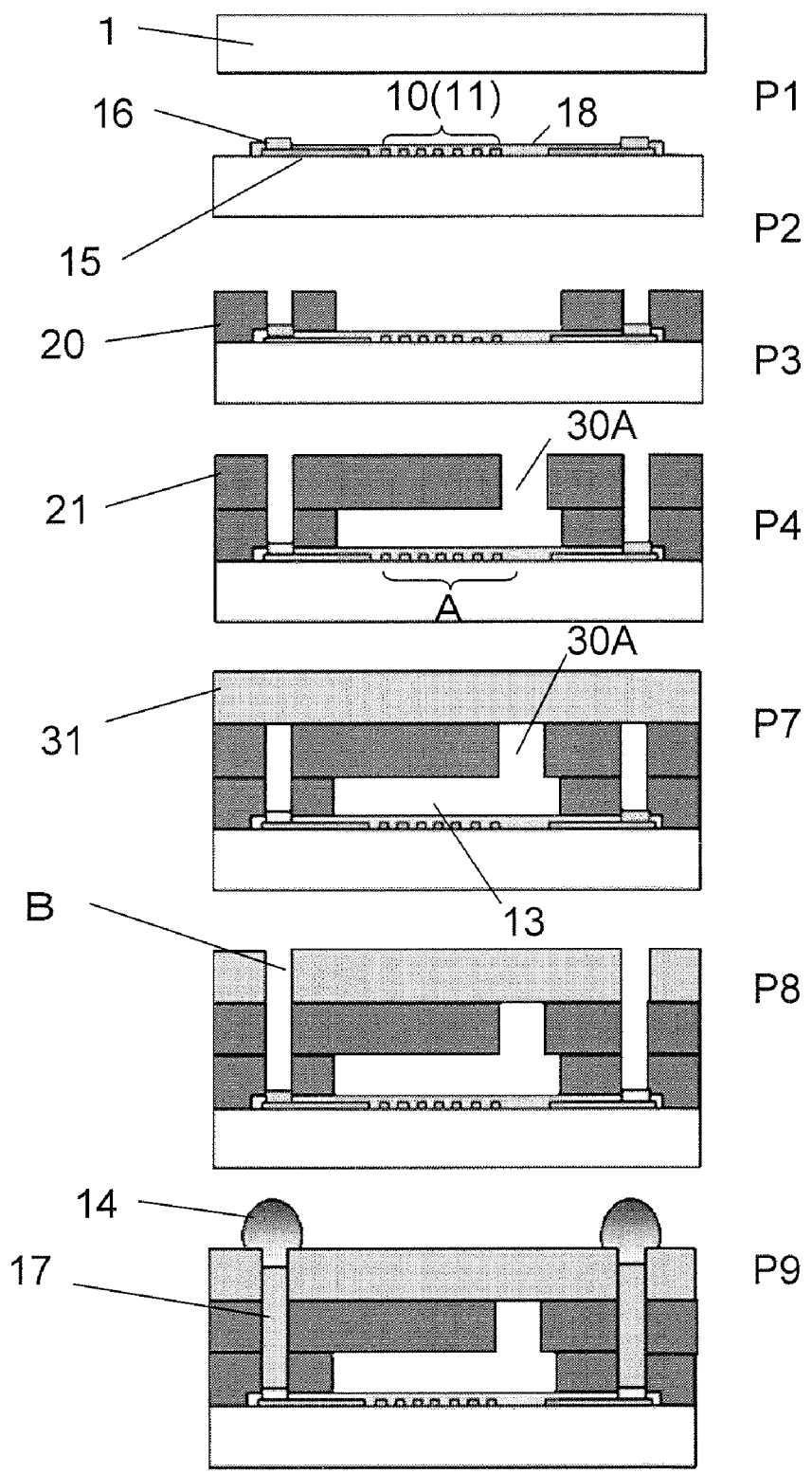
FIG. 7 is a process diagram explaining the manufacturing process according to the second embodiment.

FIG. 7 is a process diagram explaining the manufacturing process according to the second embodiment. In FIG. 7, the processing processes P1 through P4 are similar to the processes of the first embodiment shown in FIG. 5.

Next, in the processing process P4, in a state that a hollow structure is formed on the drive electrode portion A, heating is made in vacuum (appropriately 1 Torr) to 200-250° C. With this, the halogen gas, which is included in the photosensitive resist of frame-shaped layer 20 and lid body 21 and generated by heating, can be removed via through hole 30A.

To remove the halogen gas more efficiently, it is preferable to heat in vacuum after being retained for a predetermined time under a high humidity environment (85-100% RH) and a high temperature environment (100-120° C.). Alternatively, it may also be possible to heat the substrate (100-250° C.) in $H_2O$ plasma.

Thereafter, a halogen-free thermosetting film resist 31 is bonded on lid body 21 by means of the tenting method (processing process P7). With this, it is possible to form hollow 13 of the drive electrode portion A including no halogen gas.

In a portion corresponding to the metal post formation portion B, a thermosetting film resist 31 is holed using laser (processing process P8). Alternatively, it is also possible to use the thermosetting film resist on which a hole is formed in advance corresponding to the metal post formation portion B.

Thereafter, there are formed a nickel metal post 17 on the metal post formation portion B, and a solder ball 14 of SnAgCu alloy thereon (processing process P9).

Figure 8:
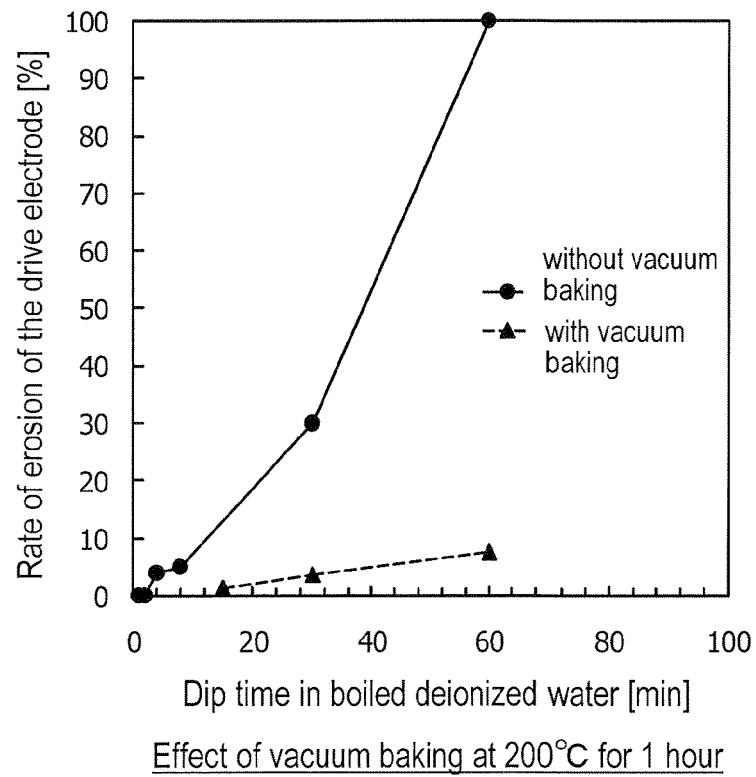
FIG. 8 is an example showing the effects to remove the halogen gas generated after the vacuum baking was performed.
Figure 9:
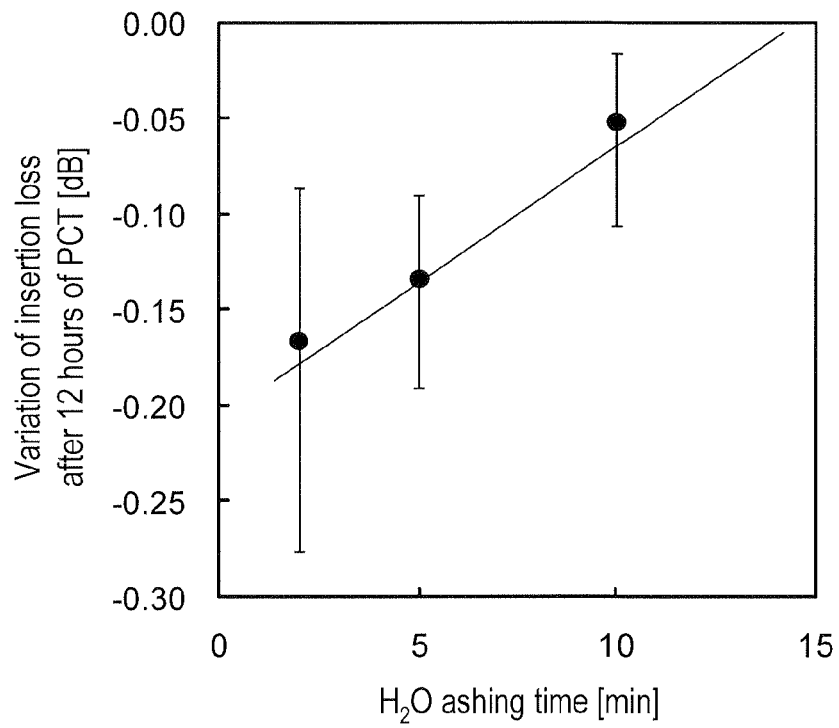
FIG. 9 is an example showing the effects to remove the halogen gas generated after $H_2O$ ashing was performed.

FIGS. 8 and 9 are diagrams explaining effects by the present invention. In particular, there are shown diagrams (part 1 and part 2) explaining the effects of a vacuum heating process (vacuum baking) to efficiently remove the halogen gas generated from frame-shaped layer 20 and lid body 21, in the above explanation of the embodiments.

In the example shown in FIG. 8, the vacuum baking was performed for one hour (1 Torr, 200° C.) after lid body 21 was formed in the first embodiment. Further, after through hole 30A was sealed with a halogen-free resin, the sample was dipped in boiled deionized water (100° C.) so as to confirm the effect against erosion, and the erosion of the drive electrode (IDT) was confirmed.

For the sample on which the vacuum baking was not performed, the entire IDTs were eroded after being dipped for 60 minutes. In contrast, in regard to the sample on which the vacuum baking was performed, it was confirmed that only 7.5% was eroded even after being dipped for one hour.

Further, in the example shown in FIG. 9, after the lid body was formed, $H_2O$ ashing was performed (at 250° C.). Further, after through hole 30A was sealed with a halogen-free resin, the sample was examined under a pressure cooker test (PCT) to confirm the effect against erosion. After the sample has been retained for 12 hours under the environments of 121° C., 2 atm and 95% RH, the characteristic of the sample was confirmed.

As a result, it has been understood from FIG. 9 that, as the $H_2O$ ashing time is set longer, there occurs a smaller variation of insertion loss after the PCT, as well as a smaller erosion of the drive electrode.

What is claimed is:

1. A manufacturing method of a surface acoustic wave device comprising the steps of:
    on a piezoelectric substrate, forming an electrode for a formation of the surface acoustic wave;
    forming a frame-shaped layer surrounding the electrode for the formation of the surface acoustic wave being formed on the piezoelectric substrate;
    on the frame-shaped layer, forming a lid body by bonding, having a through hole, so as to form a hollow between the lid body and the electrode for formation of the surface acoustic wave;
    removing a halogen gas generated from the frame-shaped layer and the lid body via the through hole, by heating in a vacuum in a state of being bonded with the lid body; and
    after removing the halogen gas, sealing the through hole with a halogen-free thermosetting resin.

2. The manufacturing method of the surface acoustic wave device according to claim 1,
    wherein the step of removing the halogen gas via the through hole includes heating in the vacuum after retaining in an environment of high humidity and high temperature for a predetermined time.

3. The manufacturing method of the surface acoustic wave device according to claim 1,
    wherein the step of removing the halogen gas via the through hole includes processing in $H_2O$ plasma.

4. The manufacturing method of the surface acoustic wave device according to claim 1,
    wherein the step of forming the frame-shaped layer includes a step of spin coating a photosensitive negative resist.

5. The manufacturing method of the surface acoustic wave device according to claim 1,
    wherein the step of forming the hollow by forming the lid body by bonding includes a step of forming a film-shaped photosensitive negative resist on the frame-shaped layer.

6. The manufacturing method of the surface acoustic wave device according to claim 1,
    wherein the step of sealing the through hole includes a step of printing a paste-form halogen-free thermosetting resin inside the through hole.

7. The manufacturing method of the surface acoustic wave device according to claim 1,
    wherein the step of sealing the through hole includes a step of forming a film-shaped halogen-free thermosetting resin on the lid body.

* * * * *